United States Patent
Shimai

(10) Patent No.: US 7,717,295 B2
(45) Date of Patent: May 18, 2010

(54) TREATMENT SOLUTION SUPPLY APPARATUS

(75) Inventor: Futoshi Shimai, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 401 days.

(21) Appl. No.: 11/820,430

(22) Filed: Jun. 19, 2007

(65) Prior Publication Data
US 2007/0289529 A1    Dec. 20, 2007

(30) Foreign Application Priority Data
Jun. 19, 2006    (JP)    ............... 2006-168365

(51) Int. Cl.
*B67D 1/00*    (2006.01)
(52) U.S. Cl. .......................... 222/63; 222/71
(58) Field of Classification Search .................. 222/63, 222/1, 52, 55, 56, 59, 71–73; 134/111, 113, 134/184, 188, 191, 195, 198
See application file for complete search history.

(56) References Cited

U.S. PATENT DOCUMENTS 5,647,386 A * 7/1997 Kaiser ..................... 134/113
6,524,463 B2 * 2/2003 Gramarossa et al. ........ 205/137
7,431,015 B2 * 10/2008 Mahoney et al. ............ 123/434
2005/0173458 A1 * 8/2005 Hiranaga et al. ............ 222/263

FOREIGN PATENT DOCUMENTS

| DE | 2003-195879 | * 11/2002 | ............... 222/63 |
| JP | 10-216605 | * 8/1998 | ............... 222/63 |
| JP | 2004-197516 | | 7/2003 |

* cited by examiner

*Primary Examiner*—Lien T Ngo
(74) *Attorney, Agent, or Firm*—Carrier, Blackman & Associates P.C.; Joseph P. Carrier; William D. Blackman

(57) ABSTRACT

A treatment solution supply apparatus capable of reducing an initial overshooting amount and ensuring a stable dispense characteristic even when treating a large amount of substrates as recycling a developing solution for a large amount of substrates includes a flow meter having an integration function in the vicinity of a nozzle and carries out feedback to the pump revolution frequency control in response to a variation of the flow meter, so that a fixed amount of a solution may be regularly discharged irrespective of the clogging level of a filter. Also, a developing solution can be stably dispensed on a resist coated film within a solution applicable range from a minimum value (film thickness of 1 mm) to a maximum value (3 mm).

10 Claims, 5 Drawing Sheets

TREATMENT SOLUTION SUPPLY APPARATUS

CROSS-REFERENCE TO RELATED APPLICATIONS

The present application claims priority from Japanese patent application 2006-168365, filed 19 Jun. 2006. The entire disclosure of the referenced priority document is incorporated herein by reference.

BACKGROUND OF THE INVENTION

1. Field of the Invention

The present invention relates to a treatment solution supply apparatus for supplying a treatment solution to a substrate such as a glass substrate, a semiconductor wafer or the like.

2. Description of the Related Art

TMAH (tetra methyl ammonium hydroxide) which is an undiluted developing solution of a positive type resist for a semiconductor is in increasing demand year by year as an undiluted solution for a semiconductor photo resist and a developing solution for TFT liquid crystal, while the collection and recycling of TMAH solution waste are becoming a problem. In the case of recycling, since the dispense condition becomes unstable due to clogging of a filter or the like caused by foreign matters contained in the recycling TMAH, it is required to stably control the dispense amount. As the art controlling the dispense amount, there are known a method of controlling a revolution frequency of a pump and a method of using a pump of constant pressure type.

FIG. 4 is a graph showing a first transition characteristic of a pump motor in a conventional treatment solution supply apparatus, wherein the relationship between an instantaneous flow amount (L/second) and time (second) in the case where the servo revolution frequency is fixed by the manual operation and the motor is started only by the revolution frequency control of the motor is shown. When starting the motor, the instantaneous flow amount reaches 7 L/second in a second and 9 L/second in two seconds so as to exceed the preset revolution frequency. Further, in three seconds it is overshot up to 12 L/second or more and although it is inclined to decrease from 4 seconds later, there is 8.5 L/second of the instantaneous flow amount still in five seconds and it takes 9 seconds to allow the instantaneous follow amount to stabilize at 8 L/second.

In Patent document 1, as shown in FIG. 5, there is disclosed an operation control method of a quantitative pump for transporting a predetermined amount of liquid waste from a flow control tank to a treatment tank in a liquid waste treatment facility. Namely, there is disclosed such art that an inverter for controlling the revolution speed of a pump and an electromagnetic flow meter for measuring the discharge amount are used together, a signal from the electromagnetic flow meter is fed back to the inverter or an external control device to allow the inverter or the external control device to automatically control the revolution speed so as to fix the discharge amount at a predetermined level, and a cleaning operation is carried out by increasing the revolution speed just after starting the pump or just before stopping it or only for a predetermined fixed period just after the starting or just before the stopping.

Moreover, in Patent document 2, there is disclosed art of supplying substantially a fixed amount of a developing solution into a wafer surface in such a manner that an inside of a supply nozzle is divided in the longitudinal direction thereof to form a plurality of treatment solution channels, and a moving speed of the supply nozzle is changed in each of solution applying regions of a wafer to allow the discharge amount per unit area within a scanning distance to be fixed at the same level even if the discharge amount is varied by changing the pumping pressure of the pump in each of the solution applying regions.

Patent document 1: Japanese patent application publication No. 2005-9329

Patent document 2: Japanese patent application publication No. 2003-197516

In the art of Patent document 1, an inverter control is carried out and the operation frequency is controlled with an alternating current motor by an inverter method. In the case of operating a general purpose motor by an inverter, a frequency-torque characteristic has a peak as shown in FIG. 5. In this example the peak is 60 Hz and torque values decrease on both sides of the peak, especially on a low frequency (revolution frequency) region so that a starting torque is inclined to a shortage. Although as a method of improving the shortage of torque in the low revolution frequency region, there are a method of using an exclusive inverter motor and a method of using variable voltage and variable frequency control, there is a problem that each of the methods requires an increase in costs.

In the art of Patent document 2, it is possible to control the flow amount, but the pump pressure is low and a discharge amount per unit time of the developing solution is small so that it is required to decrease the moving speed of the nozzle and increase the time that the nozzle stays in the predetermined region in order to increase the solution applying period. Therefore, there is a problem that it takes time for ensuring the predetermined discharge amount of the developing solution.

SUMMARY OF THE INVENTION

In view of the above mentioned problems, the present invention aims to shorten a treatment period for a wafer and decreasing a waste of a treatment solution in a treatment solution supply apparatus.

In order to solve the above mentioned problems, in accordance with the present invention, a treatment solution supply apparatus comprises a storage tank for a treatment solution, a pump for supplying the treatment solution, and a nozzle for discharging the treatment solution, wherein the treatment solution supply apparatus has a flow meter capable of integrating a flow amount to integrate a discharge amount of the treatment solution from an initial discharge stage of ON state when an ON/OFF of dispense is executed, so as to quantify the discharge amount of the treatment solution from the nozzle, and wherein the flow meter has a feedback system for having the revolution frequency of the pump varied by the discharge amount from the nozzle.

The flow meter has the feedback system for having the revolution frequency varied by the discharge amount from the nozzle, and in the flow control at the rise time of pump controlled by a servo motor in the feedback system, a fixed number control is carried out up to a predetermined time (for example, three seconds later) and thereafter switched to a feedback control to hold an integrating flow amount constant.

Further, the feedback system is adapted to recognize and compute an integrated amount of an instantaneous flow amount at a constant speed and all the discharge amount at the rise time, at the time of constant speed and at the fall time so as to control the revolution frequency at the time of discharge.

The treatment solution supply apparatus according to the present invention carries out the feedback to the control of the pump revolution frequency in response to a variation of the flow meter, so that the fixed amount of the solution may be regularly discharged irrespective of the clogging level of a filter. Also, the developing solution can be stably dispensed on a resist coated film within a solution applicable range from a minimum value (film thickness of 1 mm) to a maximum value (3 mm). Therefore, it is possible to reduce costs without wasting the developing solution and to facilitate the recycling of the developing solution.

Further, the stable discharge amount of the treatment solution can be supplied by carrying out the feedback control, irrespective of the aged deterioration and individual instrumental differences of the pump, filter, nozzle, electromagnetic valve and the like.

Still further, in the starting time of the dispense, it is possible to prevent the excessive discharge due to the overshooting occurring at the rise time of the pump motor in the initial stage of discharge so as to shorten the time from the rise to the stabilization at a predetermined flow value thereby preventing unevenness in the supply of the treatment solution.

In the case of using the recycling product of the developing solution in a manufacturing process of semiconductors or liquid crystal displays, it is not required to use the inverter while it is possible to provide the treatment solution supply apparatus which is less in aged deterioration than the inverter.

DETAILED DESCRIPTION OF THE PREFERRED EMBODIMENTS

Figure 1:
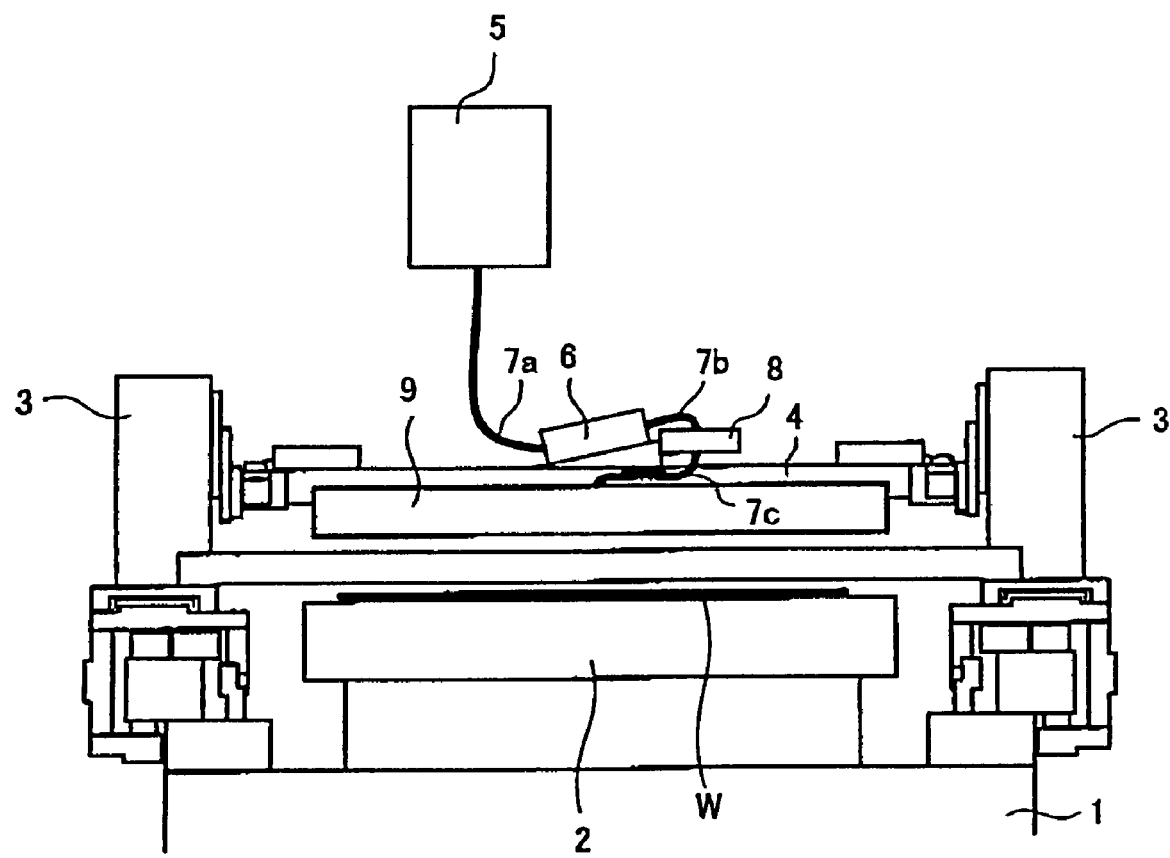
FIG. 1 is a view showing an external appearance of a treatment solution supply apparatus according to the present invention.

A preferred embodiment of the present invention will be explained in detail hereunder with reference to the accompanying drawings, in which the same reference numeral refers to elements having the same function, and repeated explanations thereof will be omitted.

FIG. 1 is an external appearance illustration of a treatment solution supply apparatus according to the present invention. On a base 1 there is mounted a substrate mounting stage 2 on which a wafer W to be treated is mounted. A nozzle lifting device 3 is provided to have a slit nozzle 9 approached up to a proper distance to the wafer W before an application of a treatment solution is started. The treatment solution to be used in treatment of the wafer W is supplied from a tank 5 through a tube 7a to a pump 6. The pump 6 is driven with a fixed number/servo circuit by a control signal from a control circuit 10 shown in FIG. 2. The treatment solution pumped out from the pump 6 is supplied from a tube 7b through a flow meter 8 and a tube 7c to the slit nozzle 9.

Figure 2:
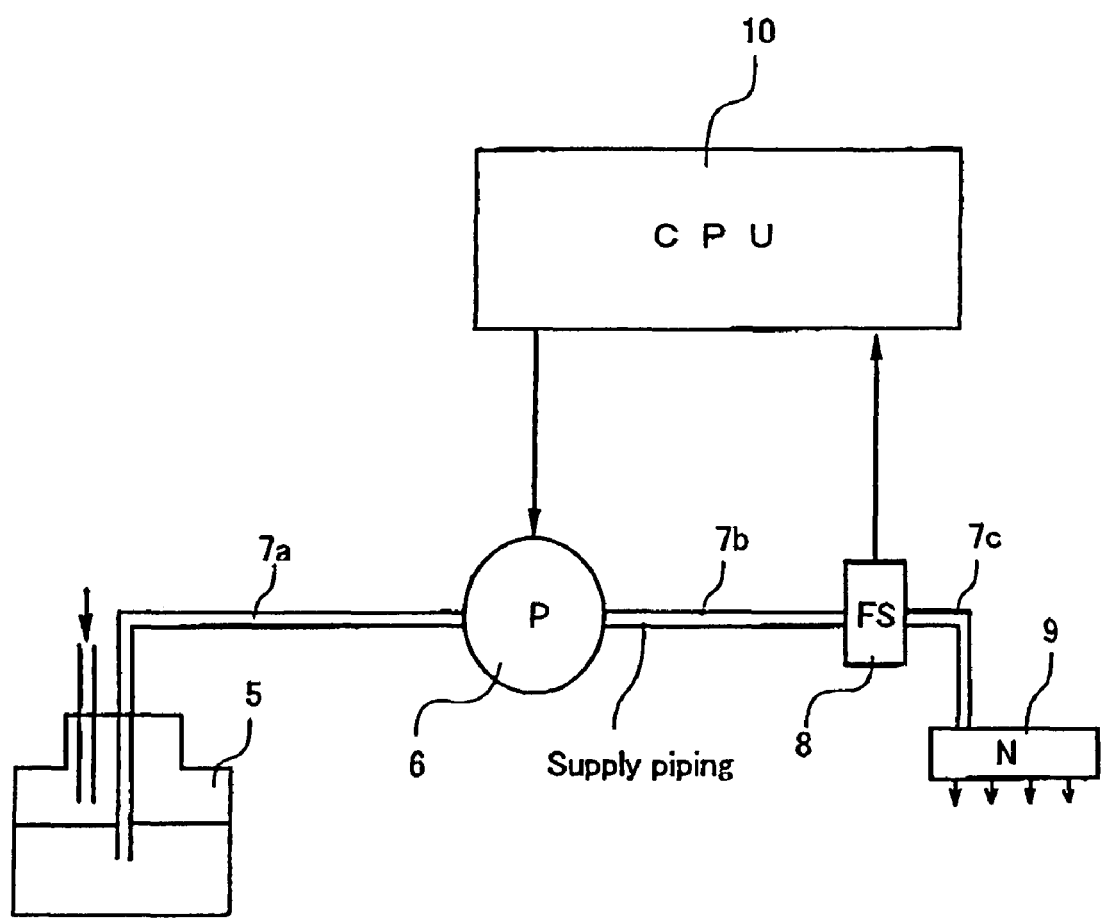
FIG. 2 is a schematic diagram showing a flow channel for a treatment solution of the treatment solution supply apparatus according to the present invention.

FIG. 2 is a schematic diagram of a treatment solution channel from the tank 5 to the slit nozzle 9. The treatment solution stored in the tank 5 is sucked by the pump 6 through the tube 7a. As the pump 6, it is possible to use a chemical gear pump GM-25X type made by Iwaki Co., Ltd. or the like, but it is not limited thereto, for example. As a driving power source of the pump 6, a DC servo motor and an AC servo motor may be used, and it is also possible to use a stepping motor.

The treatment solution transported from the pump 6 flows in the tube 7b and passes through the flow meter 8 and the tube 7c so as to enter the slit nozzle 9. The flow meter has to have a function of integration as an essential condition. The function of integration may be provided in a body of the flow meter and may be assigned to a function of an external control device.

Further, as a flow meter, there are various detection principles such as an impeller method of converting a revolution frequency of an impeller by having a measured fluid run against the impeller into a flow value, a float method of detecting the flow amount by a rising level of a float in a vertically installed pipe, an electromagnetic method to which Faraday's law is applied, etc., and a mainstream is a mechanical method and an electrical method. However, the mechanical method fails to function normally by being choked with wastes or scales in the piping and is lacking in reliability. Therefore, in this embodiment, there is not used the mechanical method but is used an electromagnetic sensor (electrical method) utilizing the law of electromagnetic induction of Faraday or an ultrasonic type sensor. Further, in the case of using the ultrasonic type sensor, there are a pulse Doppler method and a propagation time difference method and both may be used. However, in the flow amount measurement of a clean liquid such as the developing solution, it is preferable to use the propagation time difference method which is capable of stable measurement without influencing a flow velocity operation even if the sound velocity varies by the unstableness of a component, temperature, pressure or the like of the subject to be measured.

Figure 3:
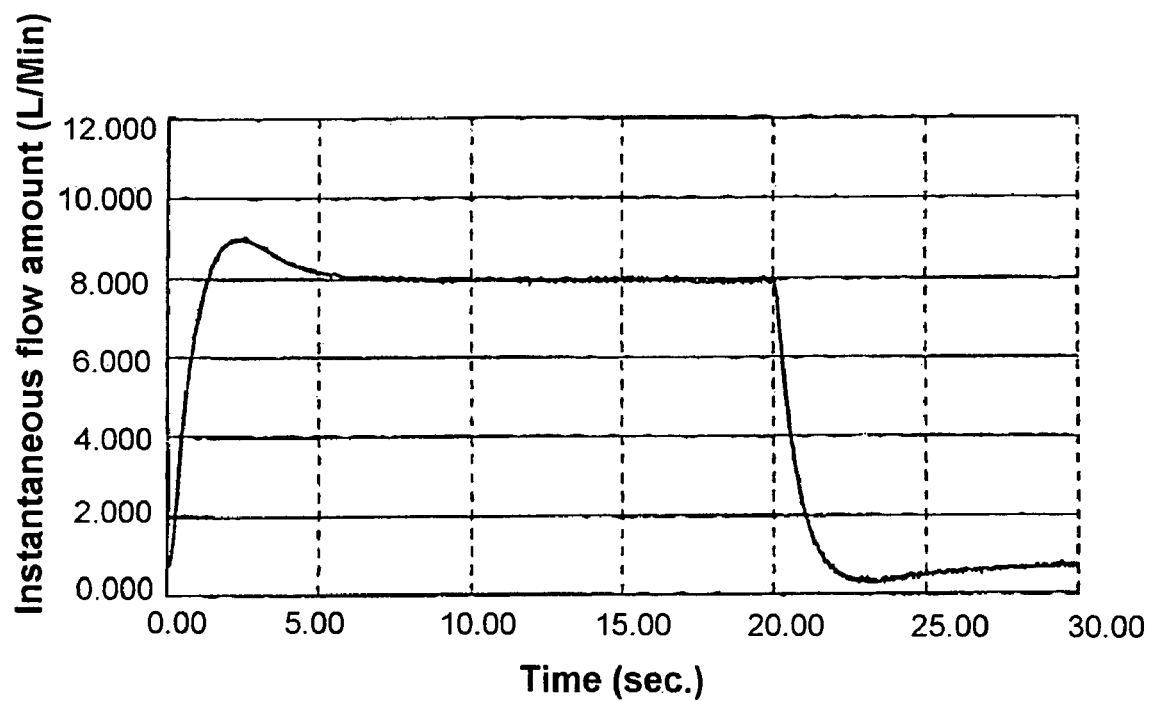
FIG. 3 is a graph showing an instantaneous flow rising characteristic of the treatment solution supply apparatus according to the present invention.

FIG. 3 is a graph showing an instantaneous rising characteristic of the treatment solution supply apparatus according to the present invention. The operation is manually carried out in the fixed state of a servo revolution frequency, and the electromagnetic flow meter having a pipe with a diameter of 15 mm is used by setting damping time at one second. As compared with FIG. 4 showing the conventional example, with respect to a peak value of first transient wave and a stabilized revolution frequency region (the region stabilizing at 8 L/second), a projected value of the conventional example was 1.4 L/second while one of this embodiment was 0.9 L/second so as to show 36% of improvement in characteristic.

Figure 4:
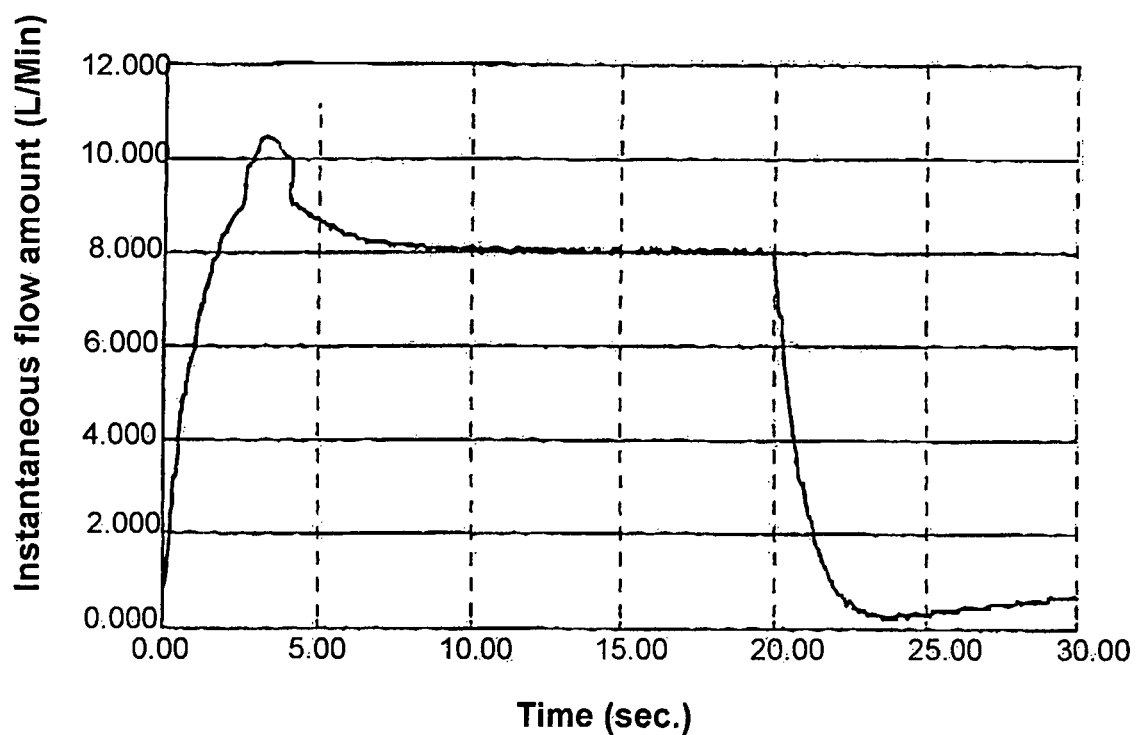
FIG. 4 is a graph showing an instantaneous flow rising characteristic of a conventional treatment solution supply apparatus.
Figure 5:
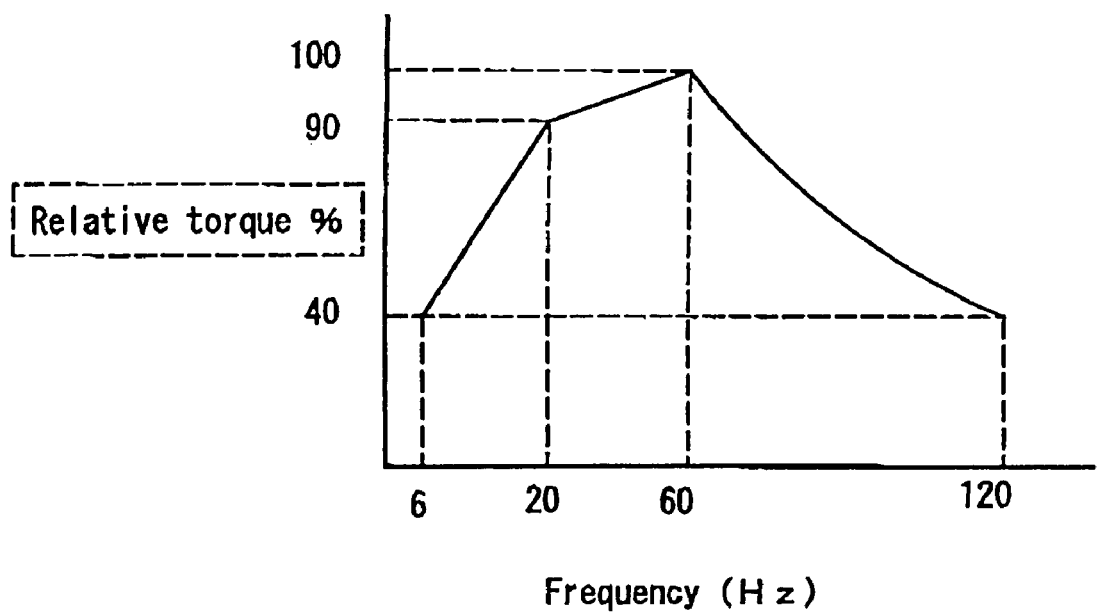
FIG. 5 is a graph showing a frequency-torque characteristic of an inverter method using a general purpose motor.

Also, with respect to the period from the motor starting to the stabilization, it took about 9 seconds in FIG. 4 while in this embodiment it was 6 seconds so as to show 33% of improvement. When comparing the period between the time first reaching 8 L/second from starting and the time stabilizing again at 8 L/second via the peak, in the conventional example it took 7 seconds while in this embodiment it was 4.5 seconds so as to show 36% of improvement. Namely, in the present invention, the stabilizing period is increased so that the integration amount becomes accurate.

As a characteristic of the present invention, there is the stability of a dispense characteristic at the time of recycling a developing solution. For example, when making a comparison between FIG. 3 of the present invention and FIG. 4 of the conventional example in the case of treating 1000 pieces of substrates (1100 mm×1300 mm: 0.7 mm in thickness) in such a dispense setting that an initial value is 3000 cc per 10 seconds and a real flow amount is from 2300 cc to 3000 cc, following results were obtained.

TABLE 1

| | Initial value | Value of thousandth substrate |
|---|---|---|
| Conventional device | 2500-3000 | 2000-2500 |
| Present invention | 2985-3015 | 2985-3015 |

As shown above, since the conventional example is not provided with a function to detect the filter clogging, in the stage of a thousandth substrate there were shown—20% in the minimum value of fluctuation and—17% in maximum value of fluctuation. Unlike this, in this embodiment since the flow amount is stabilized by the servo control using the flow meter, no fluctuation occurred.

Although there have been described what are the present embodiments of the invention, it will be understood that variations and modifications may be made thereto within the spirit and scope of the invention as reflected in the appended claims.

What is claimed is:

1. A treatment solution supply apparatus comprising:
   a storage tank for a treatment solution;
   a pump for supplying the treatment solution;
   a nozzle for discharging the treatment solution; and
   a flow meter interposed between the pump and the nozzle which monitors flow of the treatment solution to the nozzle; and
   a controller which controls operation of the pump;
   wherein the controller receives a feedback signal from the flow meter and is configured to control the operation of the pump such that a flow amount of treatment solution from the pump is integrated with a discharge amount of the treatment solution discharged from the nozzle during an entire dispensing operation beginning with an initial discharge stage of the nozzle triggered by an ON state of the pump when an ON/OFF of dispense command is executed by the controller, so as to quantify the discharge amount of the treatment solution discharged from the nozzle, and
   wherein the controller uses the feedback signal from the flow meter for controlling a revolution frequency of the pump to be varied based on the discharge amount from the nozzle.

2. The treatment solution supply apparatus according to claim 1, wherein the controller, when controlling a flow amount based on the feedback signal at the rise time of the pump by a servo motor control, carries out a PID fixed number control up to a predetermined time and thereafter controls revolution frequency of the servo motor to hold an integrating flow amount constant.

3. The treatment solution supply apparatus according to claim 2, wherein the controller is adapted to recognize and compute an integrated amount of an instantaneous flow amount at a constant speed and all the discharge amount at the rise time, at the time of constant speed and at the fall time so as to control the revolution frequency of the pump at the time of discharge.

4. The treatment solution supply apparatus according to claim 2, further comprising a filter arranged between the tank and the nozzle, and a system for automatically recognizing a time for exchanging the filter, when the dispense amount is fluctuated by fluctuation of resistance when the treatment solution passes the filter.

5. The treatment solution supply apparatus according to claim 1, wherein the flow meter functions according to any one of an electromagnetic method, an ultrasonic method and a revolution method.

6. The treatment solution supply apparatus according to claim 3, further comprising a filter arranged between the tank and the nozzle, and a system for automatically recognizing a time for exchanging the filter, when the dispense amount is fluctuated by fluctuation of resistance when the treatment solution passes the filter.

7. The treatment solution supply apparatus according to claim 1, wherein the controller controls a flow amount of the treatment solution from the pump based on the feedback signal so as to reduce excessive discharge of the treatment solution due to overshooting at the rise time of the pump in an initial stage of discharge and to shorten a time from the rise to stabilization at a predetermined flow value the treatment solution.

8. The treatment solution supply apparatus according to claim 1, wherein the controller includes one of a fixed number circuit and a servo circuit for controlling operation of the pump.

9. The treatment solution supply apparatus according to claim 1, wherein the flow meter includes one of an electromagnetic meter and an ultrasonic meter.

10. The treatment solution supply apparatus according to claim 1, wherein the nozzle is a slit nozzle.

* * * * *

UNITED STATES PATENT AND TRADEMARK OFFICE
CERTIFICATE OF CORRECTION

| | | |
|---|---|---|
| PATENT NO. | : 7,717,295 B2 | Page 1 of 1 |
| APPLICATION NO. | : 11/820430 | |
| DATED | : May 18, 2010 | |
| INVENTOR(S) | : Shimai | |

It is certified that error appears in the above-identified patent and that said Letters Patent is hereby corrected as shown below:

Column 1:
    Line 45, change "follow amount" to --flow amount--.
    Line 64, change "into a wafer" to --onto a wafer--.
    Line 67, change "in each of" to --in each of the--.

Column 2:
    Line 36, change "above mentioned" to --above-mentioned--.
    Line 38, change "a waste of a treatment solution" to --treatment solution waste--.
    Line 40, change "above mentioned" to --above-mentioned--.

Column 3:
    Line 4, change "resist coated" to --resist-coated--.

Column 4:
    Line 26, change "or an ultrasonic type" to --or an ultrasonic-type--.
    Line 27, change "using the ultrasonic type" to --using the ultrasonic-type--.
    Line 67, change "following results" to --the following results--.

Column 5:
    Line 10, change "—20%" to -- -20%--.
    Line 11, change "—17%" to -- -17%--.

Signed and Sealed this

Twelfth Day of October, 2010

David J. Kappos
*Director of the United States Patent and Trademark Office*